United States Patent [19]
Nakanishi et al.

[11] Patent Number: 6,045,927
[45] Date of Patent: *Apr. 4, 2000

[54] COMPOSITE MATERIAL FOR ELECTRONIC PART AND METHOD OF PRODUCING SAME

[75] Inventors: Hironori Nakanishi; Yuji Kawauchi, both of Yasugi; Akira Kawakami, Matsue, all of Japan

[73] Assignee: Hitachi Metals, Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/852,285

[22] Filed: May 7, 1997

[30] Foreign Application Priority Data

May 22, 1996 [JP] Japan .................................. 8-126680

[51] Int. Cl.[7] ............................. H01L 23/373; B32B 3/24
[52] U.S. Cl. .......................... 428/614; 428/635; 428/676; 257/712; 257/720; 361/709
[58] Field of Search ..................................... 428/635, 676, 428/614, 620; 257/675, 677, 706, 707, 720, 712; 361/709, 708, 710

[56] References Cited

U.S. PATENT DOCUMENTS

| | | | |
|---|---|---|---|
| 3,295,935 | 1/1967 | Pflumm et al. ........................ | 428/635 |
| 3,368,122 | 2/1968 | Fishman et al. ........................ | 428/620 |
| 3,399,332 | 8/1968 | Savolainen .............................. | 428/614 |
| 4,283,464 | 8/1981 | Hascoe ................................... | 428/620 |
| 4,427,993 | 1/1984 | Fichot et al. ........................... | 428/614 |
| 4,482,912 | 11/1984 | Chiba et al. ........................... | 428/614 |
| 4,996,115 | 2/1991 | Eerkes et al. .......................... | 428/614 |
| 5,106,433 | 4/1992 | Nakamura et al. .................... | 428/620 |
| 5,156,923 | 10/1992 | Jha et al. ................................ | 428/635 |
| 5,300,809 | 4/1994 | Nakamura et al. .................... | 257/684 |
| 5,358,795 | 10/1994 | Nakamura et al. .................... | 428/620 |

FOREIGN PATENT DOCUMENTS

| | | | |
|---|---|---|---|
| 3245935 | 9/1990 | European Pat. Off. ................. | 357/81 |
| 385605 A2 | 9/1990 | European Pat. Off. ................. | 357/81 |
| 7-80272 | 8/1995 | Japan ............................. | B32B 15/01 |
| 8-232049 | 9/1996 | Japan ............................. | C22C 38/00 |

*Primary Examiner*—John J. Zimmerman
*Attorney, Agent, or Firm*—Sughrue, Mion, Zinn Macpeak & Seas, PLLC

[57] ABSTRACT

There is disclosed a composite material for an electronic part which has high thermal conductivity in a laminated direction, and also has low-thermal expansion characteristics. The composite material, used for a heat sink or a heat spreader, includes high-thermal conductivity layers of copper or a copper alloy and low-thermal expansion layers of a Fe—Ni alloy which are alternatively laminated to form a multi-layer structure having not less than 10 layers and preferably not less than 50 layers. Any two adjacent ones of the high-thermal conductivity layers, having the low-thermal expansion layer interposed therebetween, are continuous with each other through a plurality of through holes formed through the low-thermal expansion layer. This composite material can be produced by a method in which thin sheets of copper or a copper alloy and thin sheets of a Fe—Ni alloy (having a plurality of through holes) are alternatively stacked, and this stack is sealed in a vacuum not higher than 10-3 Torr, and the stack of layers is subjected to a bonding treatment at a temperature of 700 to 1,050° C. under a pressure of not less than 50 MPa to provide a laminated structure, and this laminated structure is rolled into a sheet with a predetermined thickness.

8 Claims, 2 Drawing Sheets

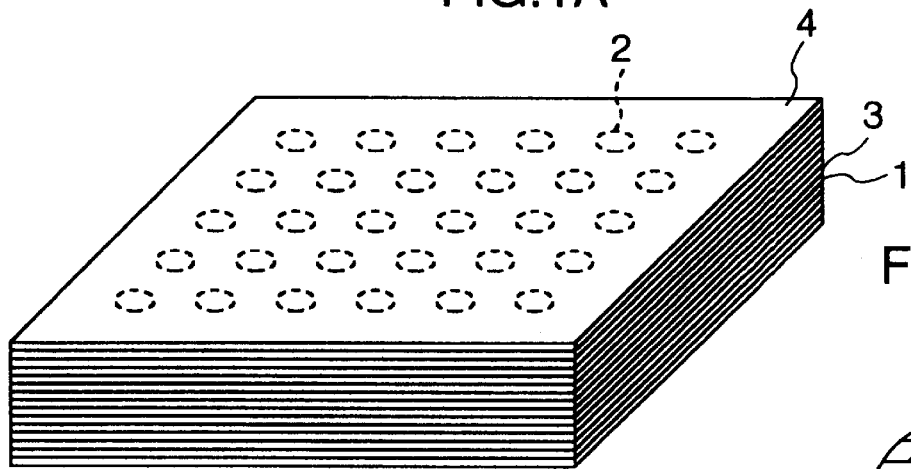
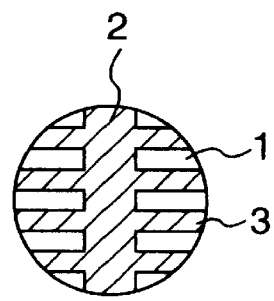
FIG.1A
FIG.1B
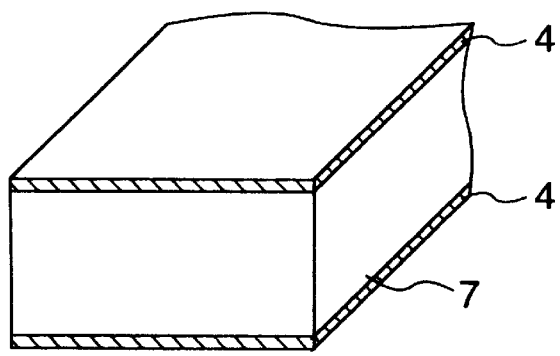
FIG.2A
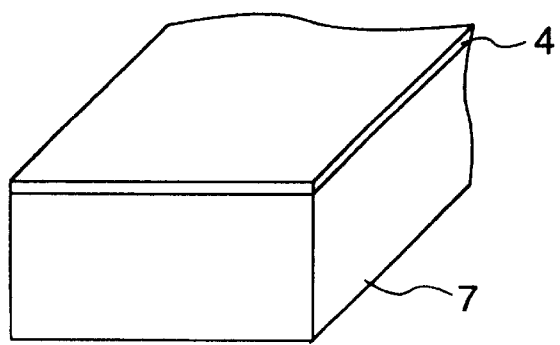
FIG.2B

COMPOSITE MATERIAL FOR ELECTRONIC PART AND METHOD OF PRODUCING SAME

BACKGROUND OF THE INVENTION

This invention relates generally to a heat-transfer base plate such as a heat spreader and a heat sink of a semiconductor device etc., and more particularly to a composite material for an electronic part, in which heat-dissipativity in a direction of the thickness of the plate is improved. The invention also relates to a semiconductor device and a method of producing such a composite material.

Generally, a ceramic package, called a PGA (Pin Grid Array), is used in a CPU (central processing unit) of a large-scale computer, a work station, a personal computer (PC) and so on, and heat, generated from a silicon chip, is dissipated through a heat-transfer base plate (heat spreader) provided between the silicon chip and aluminum heat sink fins. With a high-speed, high-power consumption design of recently-developed LSIs, it has now become quite important to effectively dissipate heat generated from a silicon chip, and particularly in an LSI and the like for a microcomputer and a logic ASIC (Application Specific IC), a heat spreader is disposed in contact with a silicon chip, thereby promoting the dissipation of heat.

For example, a BGA (Ball Grid Array) package, shown in FIG. 4, comprises a heat spreader 11, a silicon chip 8, Cu wiring 9, a polyimide film 10 for insulating purposes, and solder balls 12 serving as terminals. In this structure, the heat spreader 11 is held in contact with the silicon chip 8, and it is important that the heat spreader should have sufficient heat-dissipativity to relieve heat generated from the silicon chip 8 and that the heat spreader 11 should match in thermal expansion coefficient with the silicon chip 8. It is expected that there will be an increasing demand for this new type of package.

Since this heat spreader is in contact with the silicon chip, the heat spreader must match in thermal expansion coefficient with the silicon chip, and generally it is preferred that its thermal expansion coefficient be $4\sim11\times10^{-6}/°$ C.

To meet such characteristics requirements, a plate (having a thickness of 0.5 to 1 mm, a width of 30 mm and a length of 30 mm), made of Cu—W or Mo, has heretofore been used to provide a heat spreader. However, these materials are expensive, and also have a large specific gravity, and therefore the weight of the package is inevitably heavy, and this is a great disadvantage from the viewpoint of down-sizing which is a recent trend in LSIs.

Apart from the above-mentioned BGA-type LSI, in an LSI package of the conventional type using a lead frame, there has been used a method in which the lead frame itself is made of copper or a copper alloy having good heat dissipativity. In this case, the lead frame is higher in thermal expansion coefficient than a silicon chip, and therefore an internal stress, developing in the interface between the silicon chip and the lead frame, offers a problem, and there is a possibility that a crack develops in the silicon chip during the process or when this package is in use. In order to provide a material overcoming this problem, the inventors of the present invention et al have earlier filed a Japanese Laid-Open Patent Publication No. 8-232049 directed to a composite material for an electronic part and a method of producing the same, in which powder, composed mainly of copper or a copper alloy, is sintered to form a sintered layer on at least one side (or face) of a thin plate of a Fe—Ni alloy having a low thermal expansion coefficient.

However, in those packages (e.g. a BGA package) not using a lead frame, even if copper and a Fe—Ni alloy are merely combined together to form a multi-layer structure, it can not be applied to a heat spreader since thermal conductivity is poor in a direction of the thickness of the plate (that is, in the direction of lamination). Therefore, it has now been required to provide a heat spreader which is inexpensive, small-sized, thin and lightweight, instead of the Cu—W plate and the Mo plate. With respect to those packages not using a lead frame, the above PGA and BGA packages and a CSP (Chip Size package) have been put into practical use, and it is expected that there will be an increasing demand for these packages.

Japanese Patent Examined Publication No. 7-80272 discloses a five-layer composite material for a heat spreader in which a low thermal expansion metal plate having a plurality of through holes extending in a direction of a thickness thereof, is integrally bonded by rolling to each side (or face) of a plate of copper or a copper alloy, to provide a three-layer structure, so that the copper or the copper alloy is extended in the through holes, and a sheet of copper or a copper alloy is further bonded by rolling onto each side of the above three-layer structure so that five-layer composite material may be formed.

In this method, because of the copper or the copper alloy filled in the through holes, the high thermal conductivity in the laminated direction, which would not be obtained with a simple laminated structure, can be secured, and this is effective for the heat spreader.

However, a study by the inventors of the present invention et al have found problems that the composite material, disclosed in Japanese Patent Examined Publication No. 7-80272, is the five-layer structure at most, and that the composite material is liable to be warped through the heating of the end surfaces since the layers are different in thermal expansion characteristics.

In the production method disclosed in Japanese Patent Examined Publication No. 7-80272, the cold rolling is used, and even if diffusion annealing is used after the layers are laminated together, a diffusion layer, formed between the adjacent layers, is thin, so that non-bonded portions may be partially formed, and therefore this composite material to be joined to form the semiconductor device is not entirely satisfactory in reliability.

SUMMARY OF THE INVENTION

With the above problems in view, it is an object of this invention to provide a composite material for an electronic part which has high thermal conductivity in a laminated direction, which also has low-thermal expansion characteristics, and which is reliable.

Another object of the invention is to provide a semiconductor device and a method of producing such a composite material.

The inventors of the present invention have made an extensive study in order to prevent the adverse effects from being caused by the difference in thermal expansion characteristics when a composite material is formed by Fe—Ni alloy layers having a plurality of through holes as described above, and copper or copper alloy layers. Consequently, the inventors have provided a multi-layer structure having not less than 10 layers and have also substantially eliminated disadvantages having been caused due to the difference in thermal expansion characteristics between the layers.

More specifically, according to the present invention, there is provided a composite material for an electronic part comprising high-thermal conductivity layers of copper or a copper alloy and low-thermal expansion layers of a Fe—Ni alloy which are alternatively laminated to form a multi-layer structure having not less than 10 layers, wherein any two adjacent ones of the high-thermal conductivity layers, having the low-thermal expansion layer interposed therebetween, are continuous with each other through a plurality of through holes formed through the low-thermal expansion layer.

Preferably, the multi-layer structure may have layers not less than 50 layers.

The above composite material of the invention for an electronic part can be produced by a method of producing a composite material for an electronic part, comprising the steps of:

alternately stacking thin sheets of copper or a copper alloy and thin sheets of a Fe—Ni alloy to provide a stack having not less than 10 layers, and filling a can with the stack, each of the thin sheets of the Fe—Ni alloy having a plurality of through holes;

subsequently evacuating air from the interior of the can to a vacuum not higher than $10^{-3}$ Torr, and subsequently sealing the can;

subsequently subjecting the stack of layers to a bonding treatment at a temperature of 700 to 1,050° C. under a pressure of not less than 50 MPa to provide a laminated structure, so that the through holes are filled with the copper materials or the copper alloy materials bonded together; and subsequently rolling the laminated structure into a sheet with a predetermined thickness.

In the composite material of the invention for an electronic part obtained with this method, any two adjacent high-thermal conductivity layers are bonded together midway in the through holes formed through the low-thermal expansion layer interposed therebetween, and preferably the bonding portions are diffusion bonded together.

Preferably, the thickness of the low-thermal expansion layers may be not more than 0.1 mm.

Preferably, with respect to the overall structure of the composite material, a continuous (, that is, without any hole), high-thermal conductivity layer of a copper or a copper alloy or a continuous, low-thermal expansion layer of a Fe—Ni alloy may be provided at at least one of the opposite outermost sides of the multi-layer structure.

BRIEF DESCRIPTION OF THE DRAWINGS

FIG. 1A is a perspective view showing one example of a basic structure of a composite material of the present invention;

FIG. 1B is a sentional view showing a portion of the material of FIG. 1;

FIGS. 2A and 2B are conceptual views showing a preferred example of outermost layers of the composite material of the invention;

DESCRIPTION OF THE PREFERRED EMBODIMENTS

One feature of the present invention is that there is achieved a multi-layer structure having not less than 10 layers, and preferably not less than 50 layers, and the invention seeks to suppress warpage of this multi-layer structure which warpage had been apt to occur in prior art due to the difference in thermal expansion coefficient between the high-thermal conductivity layers of copper or a copper alloy and the low-thermal expansion layers of a Fe—Ni alloy.

In a case where a multi-layer structure is joined to a semiconductor device, there is a risk of separation if this structure is warped. If separation occurs, the semiconductor can not dissipate heat, and this not only deteriorates the performance of the semiconductor but also causes damage to the semiconductor. The present inventors have discovered that the more the number of the layers of the multi-layer structure increases, the more it is possible to minimizing the warpage of the multi-layer structure occurring due to the difference in thermal expansion characteristics between the low-thermal expansion layers and the high-thermal conductivity layers.

In the present invention, the high-thermal conductivity layers are continuous with one another through the through holes, and a preferred structural feature of the invention may be that any two adjacent high-thermal conductivity layers (composed, for example, of Cu or a Cu alloy) protrude into each of the through holes, formed through the low-thermal expansion layer interposed therebetween, from opposite sides of the through hole, and contact each other midway in the through hole. Such a state as to allow the heat to dissipate through the high-thermal conductivity layers suffices for this contact. It is more preferred for the protruded portions contacted with each other to be so intimately contacted as to be bonded each other in the through holes.

In the present invention, these states are collectively called "bonding".

Figure 5A:
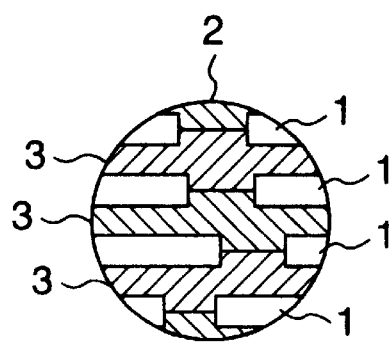
FIGS. 5A and 5B are enlarged views showing through hole portions.

As shown in FIG. 5A, actually, it is difficult from the viewpoint of the manufacture to completely align the through holes 2 provided in each of the low-thermal expansion layers 1 stacked in the thickness-wise direction, and the through holes 2 in one low-thermal expansion layer 1 are more or less out of alignment with the through holes 2 in another low-thermal expansion layer 1. In the present invention, such a state as the high-thermal conductivity layers 3 are bonded together in the through holes saffices irrespective of whether or not the through holes are aligned, and the structure shown in FIG. 5A is sufficient.

Figure 5B:
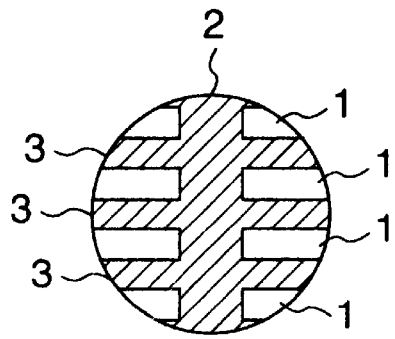

To enhance the thermal conductivity, it is preferred that the through holes 2 be aligned as shown in FIG. 5B. Preferably, the bonding portions of the high-thermal conductivity layers may be diffusion bonded together rather than bonded in such a manner as the interface of bonding exists clearly, because the former enhances the thermal conductivity.

It is possible to form a heat spreader by use of the composite material embodying the present invention. By bonding the thus formed heat spreader onto a semiconductor chip, it is possible to obtain a semiconductor device having high reliability.

The inventors of the present invention made an extensive study in order to achieve the multi-layer structure having not less than 10 layers, and in order that any two adjacent high-thermal conductivity layers, having the low-thermal expansion layer interposed therebetween, can be continuous with each other through the plurality of through holes formed through the low-thermal expansion layer, the layers are stacked together, and then this stack is packed in a can, and then air from the interior of the can is evacuated to a vacuum not higher than 10−3 Torr, and the can is sealed, and then the stack of layers are subjected to a bonding treatment at a temperature of 700 to 1,050° C. under a pressure of not less than 50 MPa.

Thus, by use of the process having the steps of evacuating air from the interior of the can holding the stack of layers therein, and then heating and bonding the stack of layers under high pressure, the composite material, having the high-thermal conductivity layers contiguous with one another through the through holes, can be formed to have the multi-layer structure of not less than 10 layers without the use of a rolling/press-bonding method which had been used to form a multi-layer structure having 5 layers at most.

The composite material, obtained with this method, has a structure in which the high-thermal conductivity layers are diffusion bonded together midway in the through holes formed through the low-thermal expansion layers.

In the present invention, preferably, the thickness of each low-thermal expansion layer is as small as not more than 0.1 mm. By forming such thin low-thermal expansion layers into a multi-layer arrangement, deformation, such as warpage having occurred due to the difference in thermal expansion coefficient, can be positively suppressed. One or both of the opposite outermost layers are formed by the high-thermal conductivity layer of copper or a copper alloy continuous (, that is, having no hole or not interrupted at any portion) over an entire surface thereof. Alternatively, one or both of the opposite outermost layers are formed by the low-thermal expansion layer of a Fe—Ni alloy continuous over an entire surface thereof.

By thus forming the outermost layer either by the high-thermal conductivity layer of copper or a copper alloy with no hole or by the low-thermal expansion layer of a Fe—Ni alloy with no hole, the unevenness on the surface at the time of a plating treatment is eliminated, so that good platability can be obtained.

Whether the outermost layer is formed by the high-thermal conductivity layer or the low-thermal expansion layer is determined according to required characteristics of a device from which heat is dissipated.

For example, when low-thermal expansion characteristics are particularly required for the bonding surface, the outermost layer can be formed by the low-thermal expansion layer, and when high-thermal conductivity characteristics are required for the bonding surface, the outermost layer can be formed by the high-thermal conductivity layer.

FIG. 1A shows the basic structure of the composite material of the invention in which the high-thermal conductivity layers of copper or a copper alloy and the low-thermal expansion layers of a Fe—Ni alloy are laminated together. FIG. 1A shows a state where the low-thermal expansion layers 1 and the high-thermal conductivity layers 3 of the composite material 5 of the multi-layer structure are bonded together. As shown in FIG. 1B, any two adjacent high-thermal conductivity layers 3, disposed respectively on the opposite sides of the low-thermal expansion layer 1, are made continuous with each other by the copper or the copper alloy extended in the through holes 2.

With this structure, heat-transfer paths, extending through the low-thermal expansion layers of a Fe—Ni alloy, are secured.

As shown in FIGS. 2A and 2B, in the present invention, one or both of the opposite outermost layers 4 of the composite material 5 can be formed by a high-thermal conductivity material of copper or a copper alloy continuous (, that is, having no hole) over an entire surface thereof or by a continuous low-thermal expansion material of a Fe—Ni alloy having no hole.

In the present invention, in order to obtain the diffusion layers which are sufficiently thick and which do not separate, the pressure of not less than 50 MPa is applied in the temperature range of 700 to 1,050° C.

When the high pressure of not less than 50 MPa is used, the diffusion layers, which are far thicker than those formed by pressure-bonding by a conventional cold rolling method and annealing, can be formed in the temperature range of 700 to 1,050° C.

The higher the pressure, the more preferred, but the pressure of not more than 200 MPa is practical from the viewpoint of the performance of the apparatus, and the preferred temperature range is 80 to 150 MPa.

In the present invention, if the temperature is less than 700° C., the diffusion is insufficient, so that the sufficient bonding strength can not be obtained. If the temperature is more than 1,050° C., the oxidation of the surface of the copper or the copper alloy becomes conspicuous, so that the sufficient bonding strength can not be obtained, and in some cases, the copper or the copper alloy melts, and therefore this is not desirable.

Therefore, in the present invention, the temperature is set to the range of 700 to 1,050° C.

In the present invention, prior to the above bonding treatment, there is provided a step in which the stack of layers are packed in the can, and then air within the can is evacuated to a vacuum of not higher than $10^{-3}$ Torr, and then the can is sealed.

The reason for this is that if gas remains in the through holes formed through the Fe—Ni alloy sheets, the copper or the copper alloy fails to be sufficiently extended in the through holes, or the copper materials and the copper alloy materials, extended into each through hole respectively from the opposite sides thereof, can not be bonded together in a degree enough to achieve the heat dissipation. For these reasons, the degassing treatment is effected.

In the present invention, after the above bonding treatment, the composite material is finished into a predetermined thickness by hot rolling or cold rolling.

In the present invention, the bonding treatment is effected under the high pressure, but only with this treatment, it is difficult to sufficiently fill the through holes with the copper or the copper alloy.

Therefore, in the present invention, the hot rolling or the cold rolling is effected after the bonding treatment.

The composite material of the invention for an electronic part, obtained with this method, has the structure in which the high-thermal conductivity layers are bonded together midway in the through holes formed through the low-thermal expansion layers. Namely, by application of the high pressure, any two adjacent high-thermal conductivity layers flow into each of the through holes, formed through the low-thermal expansion layer interposed therebetween, respectively from the opposite sides of the through hole, and are bonded together midway in the through hole.

Incidentally, if the cold rolling is used subsequently, the cleanliness and flatness required for the composite material to be used for an electronic part can be easily obtained.

In the present invention, the low-thermal expansion layers of a Fe—Ni alloy are provided primarily in order that the composite material of the invention can have a low thermal expansion coefficient. Preferably, the low-thermal expansion layers are so arranged that the thermal expansion coefficient of the composite material is close to that of a semiconductor device, that is, its thermal expansion coefficient at temperatures of 30° C. to 300° C. is in the range of 4 to 11×10⁻⁶/° C. Therefore, preferably, the Fe—Ni alloy may contain by weight 25~60% Ni, and alloy may contain at least one main component (or element) selected from the group consisting of Fe and Co. Specifically, as the Fe—Ni alloy, there can be used an alloy consisting essentially by weight of 30~60% Ni and the balance Fe, or an alloy of this composition except that part of Ni is replaced by Co. Examples of such Fe—Ni alloy may include Fe-42% Ni alloy, Fe-36% Ni alloy, Fe-31% Ni-5% Co alloy, and Fe-29% Ni-17% Co alloy.

Other additive elements may, of course, be contained in the Fe—Ni alloy, and not more than 15% Cr may be contained, and to meet various requirements concerning thermal expansion characteristics, mechanical strength and so on, the elements of groups 4A, 5A and 6A may be added in so far as the austenitic structure, which will not adversely affect the low-thermal expansion characteristics, can be maintained.

For example, not more than 15 wt. % Cr, which is effective for forming an oxide film, may be added, and as the elements improving the strength, not more than 5 wt. % of Nb, Ti, Zr, W, Mo or Cu can be added, and as the elements improving the hot workability, not more than 5 wt. % of Si or Mn, or not more than 0.1 wt. % of Ca, B or Mg may be added.

In the present invention, the high-thermal conductivity layers may be composed of copper or a copper alloy. Pure copper is excellent in thermal conductivity, and is effective for a heat sink and a heat spreader in which the thermal conductivity is considered as being important, and in some cases one or more alloy elements may be added so as to improve characteristics or properties, such as mechanical strength, solderability, silver solderability and heat resistance, depending on its use. For example, Sn and Ni is brought into a solid-solution state in copper or a copper alloy, thereby enhancing the mechanical strength. Ti, when added in combination with Ni, precipitates as a compound of Ni and Ti in the copper matrix, thereby enhancing the mechanical strength and thermal resistance. It is known that Zr enhances the weatherability of solder. Al, Si, Mn and Mg improve the intimate contact with a resin.

The copper or copper alloy layers in the present invention are provided for the purpose of imparting heat dissipativity, and therefore preferably, the content of the above additive elements (which lower the heat dissipativity) in the copper alloy is not more than 10 wt. %.

EXAMLPES

The present invention will now be illustrated by way of Examples.

As materials for low-thermal expansion layers, Fe-42%Ni alloy, Fe-36% Ni alloy, Fe-31% Ni-5% Co alloy and Fe-29% Ni-17% Co alloy were selected, and the material was repeatedly cold rolled and annealed to be formed into a thin sheet of the Fe—Ni alloy having a thickness of 0.3 mm. Through holes each having a diameter of 0.8 mm were formed by photo-etching through this Fe—Ni alloy sheet at a pitch of 1 mm over an entire surface thereof.

Figure 3A:
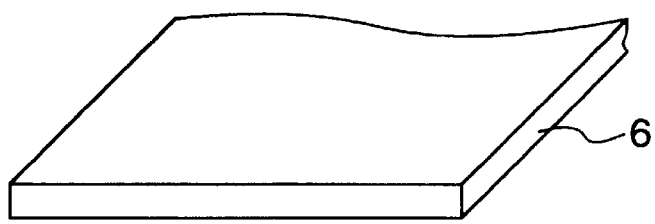
FIGS. 3A and 3B are views explanatory or sheets for forming the composite material of the invention.
Figure 3B:
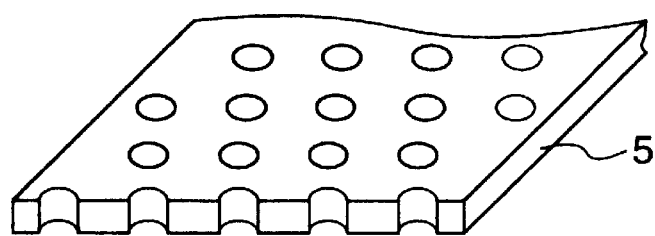
Figure 4:
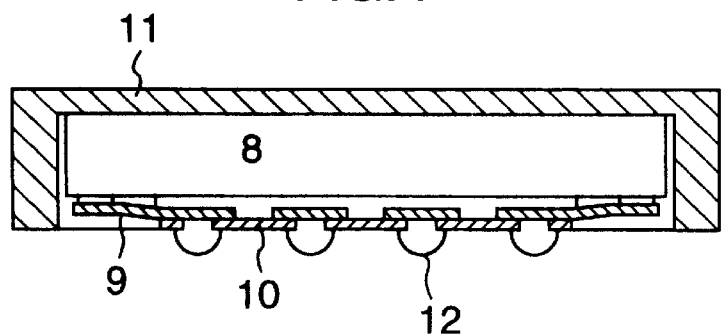
FIG. 4 is a view showing one example of a semiconductor device having a structure of a BGA package to which the invention is applied.

As materials for high-thermal conductivity layers, pure copper (oxygen-free copper), Cu-2.4% Fe-0.07% P-0.12% Zn alloy (Cu alloy A), and Cu-2.0% Sn-0.2% Ni-0.04% P-0.15% Zn alloy (Cu alloy B) were selected, and the material was processed into a thin sheet having a thickness of 0.3 mm. This thin sheet was slitted into sections each having a width of 120 mm, and then the slitted sheet was cut into a length of 800 mm by a predetermined-length cutter, thereby preparing high-thermal conductivity layer elements 6 shown in FIG. 3A. The composition of the above Cu alloys are expressed in terms of wt. %.

Then, according to combinations shown in Table 1, the high-thermal conductivity layers of the copper or the copper alloy and the low-thermal expansion layers of the Fe—Ni alloy were alternately stacked together in a casing (made of a S15C plate having a thickness of 5 mm) in such a manner that each low-thermal expansion layer was sandwiched between the high-thermal conductivity layers, thereby providing a stack structure A having 40 low-thermal expansion layers and 41 high-thermal conductivity layers, each of the opposite outermost layers of this stack structure being the continuous high-thermal conductivity layer.

To provide another example, a thin sheet (having no hole and having a thickness of 0.3 mm), made of the same material as the low-thermal expansion layers of the stack structure, was provided on each of the opposite sides of the stack structure A, thereby providing a stack structure B whose opposite outermost layers were formed respectively by the low-thermal expansion layers having no hole.

The air in the casing of S15C was evacuated to a vacuum not higher than 10⁻³ Torr, and subsequently this casing was sealed by welding.

After this degassing operation, each of the S15C casings (hereinafter referred to as "can"), having the stack structure, was subjected to hot-isostatic pressing at a pressure of 100 MPa at a temperature shown in Table 1, thereby bonding the layers of the stack structure together to provide a laminated structure of an integral structure.

After this hot-isostatic pressing, the upper and lower walls of the S15C casing, having the laminated structure, were removed by grinding, thereby providing an intermediate product to be subjected to hot rolling. This intermediate product was hot rolled in the temperature range of 700° C. and 900° C. to be formed into a sheet having a thickness of 2.5 mm. This sheet was subjected to descaling by pickling, and finally was cold rolled into a sheet having a thickness of 2 mm. The thickness of each of the layers was about 25 μm.

Then, samples for measuring thermal conductivity and samples for measuring thermal expansion were prepared from this sheet, and the thermal conductivity in a direction of the thickness of the sheet, as well as the thermal expansion coefficient in a direction of the width of the sheet, was measured.

The thermal conductivity was measured by a laser flash method, and with respect to the thermal expansion coefficient, value $\alpha_{30-300°\,C.}$ in the temperature range of 30 to 300° C. was measured.

TABLE 1

| No. | Kind of low-thermal expansion layers | Kind of high-conductivity layers | Stack structure | hot-isotatic pressing temperature (° C.) | Thermal conductivity (W/m · k) | Thermal expansion coefficient α30–300° C. (× 10⁻⁶/° C.) | Note |
|---|---|---|---|---|---|---|---|
| 1 | Fe—42%Ni | Pure copper | A | 920 | 194 | 4.7 | Invention |
| 2 | " | " | " | 1000 | 175 | 4.5 | " |
| 3 | " | " | " | 850 | 190 | 4.8 | " |
| 4 | " | " | " | 750 | 186 | 4.6 | " |
| 5 | " | Cu alloy A | " | 920 | 105 | 4.6 | " |
| 6 | " | Cu alloy B | " | 920 | 132 | 4.6 | " |
| 7 | " | Pure copper | B | 920 | 190 | 4.5 | " |
| 8 | Fe—36%Ni | Pure copper | A | 920 | 190 | 6.0 | Invention |
| 9 | " | Cu alloy A | " | 920 | 102 | 5.8 | " |
| 10 | " | Cu alloy B | " | 920 | 136 | 5.7 | " |
| 11 | " | Pure copper | " | 1000 | 180 | 6.1 | " |
| 12 | " | " | " | 850 | 185 | 5.9 | " |
| 13 | " | " | B | 920 | 187 | 5.9 | " |
| 14 | Fe—31%Ni—5%Co | " | A | 920 | 180 | 5.0 | Invention |
| 15 | " | Cu alloy A | " | 920 | 98 | 5.3 | " |
| 16 | " | Cu alloy B | B | 920 | 120 | 5.1 | " |
| 17 | " | Pure copper | A | 1000 | 170 | 5.1 | " |
| 18 | " | " | " | 850 | 182 | 5.0 | " |
| 19 | " | " | " | 750 | 184 | 5.1 | " |
| 20 | Fe—29%Ni—17%Co | Pure copper | A | 920 | 180 | 4.5 | Invention |
| 21 | " | " | B | 1000 | 164 | 4.5 | " |
| 22 | " | " | A | 850 | 176 | 4.4 | " |
| 23 | " | " | A | 750 | 170 | 4.4 | " |

As shown in Table 1, the composite materials of the invention for an electronic part have the multi-layer structure having more than 80 layers, and with this structure, these composite materials can have the high thermal conductivity of not less than 100 W/m•K and the low thermal expansion coefficient of not more than $7 \times 10^{-6}/°$ C.

In the present invention, the composite material of the multi-layer structure having not less than 10 layers can be obtained.

Therefore, as compared with the conventional composite materials having five layers at most, the composite material of the invention has a finer composite structure, and when this composite material is used as a heat spreader, deformation such as warpage due to the thermal expansion difference can be prevented.

As compared with the conventional cold press bonding-diffusion annealing method, the layers of the composite material of the invention are bonded together under high pressure at high temperature and therefore the reliability of the intimate contact is markedly enhanced, and the reliability of the part is greatly enhanced.

What is claimed is:

1. A composite material for an electronic part comprising high-thennal conductivity layers of copper or a copper alloy and low-thermal expansion layers of a Fe—Ni alloy which are alternatively laminated to form a multi-layer structure having not less than 50 layers,
   wherein any two adjacent ones of said high-thermal conductivity layers which have said low-thermal expansion layer interposed therebetween are continuous with each other through a plurality of through holes formed through said low-thermal expansion layer, and
   wherein the composite material is produced by the steps of alternately stacking thin sheets of said copper or copper alloy and thin sheets of said Fe—Ni alloy to provide a stack having not less than 10 layers, packing the stack in a can, evacuating air from an interior of the can to a vacuum of not higher than $10^{-3}$ Torr, sealing said can, subsequently subjecting said stack to a bonding treatment at a temperature of 700 to 1,050° C. under a pressure of not less than 50 MPa to provide a laminated structure so that the copper or the copper alloy materials are extended into each of said through holes respectively from opposite side thereof to thereby be bonded together.

2. A composite material for an electronic part comprising high-thermal conductivity layers of copper or a copper alloy and low-thermal expansion layers of a Fe—Ni alloy which are alternatively laminated to form a multi-layer structure having not less than 50 layers,
   wherein any two adjacent ones of said high-thermal conductivity layers which have said low-thermal expansion layer interposed therebetween are bonded together midway in a plurality of through holes formed through said low-thermal expansion layer, and
   wherein the composite material is produced by the steps of alternately stacking thin sheets of said copper or copper alloy and thin sheets of said Fe—Ni alloy to provide a stack having not less than 10 layers, packing the stack in a can, evacuating air from an interior of the can to a vacuum of not higher than $10^{-3}$ Torr, sealing said can, subsequently subjecting said stack to a bonding treatment at a temperature of 700 to 1,050° C. under a pressure of not less than 50 MPa to provide a laminated structure so that the copper or the copper alloy materials are extended into each of said through holes respectively from opposite side thereof to thereby be bonded together.

3. A composite material according to claim 1, in which a thickness of said low-thermal expansion layers is not more than 0.1 mm.

4. A composite material according to claim 1, claim 2 or claim 3, in which at least one of opposite outermost layers of said multi-layer structure is formed by a continuous, high-thermal conductivity layer of copper or a copper alloy.

5. A composite material according to claim 1, claim 2 or claim 3, in which at least one of opposite outermost layers of said multi-layer structure is formed by a continuous, low-thermal expansion layer of a Fe—Ni alloy.

6. A semiconductor device comprising a semiconductor chip, and a heat spreader bonded to the semiconductor chip which heat spreader is made of the composite material for electronic parts according to any one of claims 1 to 3.

7. A semiconductor device comprising a semiconductor chip, and a heat spreader bonded to the semiconductor chip which heat spreader is made of the composite material for electronic parts according to claim 4.

8. A semiconductor device comprising a semiconductor chip, and a heat spreader bonded to the semiconductor chip which heat spreader is made of the composite material for electronic parts according to claim 5.

* * * * *